March 22, 1966 J. GRABMAIER ET AL 3,242,018

SEMICONDUCTOR DEVICE AND METHOD OF PRODUCING IT

Filed June 15, 1961

United States Patent Office 3,242,018
Patented Mar. 22, 1966

3,242,018
SEMICONDUCTOR DEVICE AND METHOD OF PRODUCING IT

Josef Grabmaier and Theodor Rummel, Munich, Germany, assignors to Siemens & Halske Aktiengesellschaft, Berlin and Munich, Germany, a corporation of Germany Filed June 15, 1961, Ser. No. 117,401
Claims priority, application Germany, July 1, 1960, S 69,202
13 Claims. (Cl. 148—180)

Figure 1:
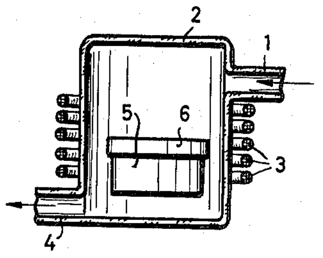

This invention relates to semiconductor devices and the particular object thereof is to provide a method of producing a semi-conductor device comprising at least one single-crystalline layer consisting of a alloy of two semiconductor materials.

In order to realize this object, it is in accordance with the invention proposed to precipitate or deposit upon a uniformly heated single-crystalline semiconductor carrier, by thermal decomposition of a gaseous compound, a layer of a semiconductor material having a melting point lower than that of the carrier material. The carrier is thereby or thereafter heated to a temperature corresponding to that of the desired alloy composition, and the alloy thus produced is thereupon tempered at a somewhat lower temperature.

According to another feature of the invention, upon this alloyed layer can be formed at least one further semiconductor layer which may be a doped layer if desired. It is of course possible to utilize the method according to the invention for alternately precipitating a plurality of alloyed layers as well as p-, n- or intrinsically conducting semiconductor layers, which consists only of one semiconductor material.

The individual layers can thereby be doped as desired, for example, during the separation or precipitation from the gas phase. The alloyed layer is advantageously doped during the alloying operation by substances contained in the carrier and/or in the layer precipitated thereon.

The method according to the present invention is employed to particular advantage when it is desired to build into the grid of a semiconductor with small band spacing, a semiconductor with great band spacing, so as to obtain a widening of the band spacing in the material of the first noted semiconductor.

In an emitter pn-junction which is poled in flow direction, the total current at the pn-junction between the emitter- and the base zone, is composed of minority carriers which are injected from the emitter into the base zone and of minority carriers which are injected from the base zone into the emitter zone, that is, of charge carriers of both signs. The current amplification of such a semiconductor device, for example, a transistor, is proportional to the emitter yield, that is, to the ratio of the current which is carried by the minority carriers injected by the emitter into the base, to the total current. In order to obtain a high current amplification factor, it is therefore, important that the ratio of the minority carriers injected from the emitter into the base zone, to the total current, lies near to 1, or that the socalled injection loss, that is, the portion of the current which is carried by the minority carriers injected from the base into the emitter, is as small as possible.

It is already known that the injection loss can be reduced by several orders of magnitude, by using as an emitter a semiconductor having a greater band spacing than the semiconductor of the base. The activating energy for the charge carriers which are injected from the base into the emitter, will then be greater than the activating energy for the charge carriers which flow from the emitter into the base. The injection loss will in such case be reduced proportional to the factor $e^{-\Delta E/kT}$, wherein $\Delta E$ represents the difference between the band spacings of the emitter- and base semiconductors. Semiconductors exhibiting different band spacing are, for example, silicon and germanium.

In order to explain the invention more in detail, there will now be described, with reference to the accompanying drawing, an embodiment which makes it possible to build over a silicon-germanium alloy, silicon into the germanium grid, so as to obtain a widening of the band spacing in the germanium crystal. Moreover, there will be described the production of a germanium transistor, employing the present method, the emitter of which consists of a germanium-silicon alloy. In addition, there will be described the production of a silicon transistor comprising two outer layers of identical conduction type and a single-crystalline intermediate layer of a germanium-silicon alloy of opposite conduction type.

Figure 2:
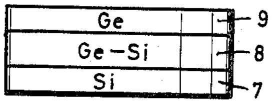
Figure 3:
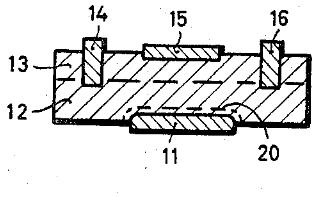
Figure 4:
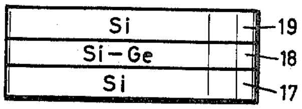

FIG. 1 shows an arrangement for practicing the invention;

FIG. 2 indicates a semiconductor arrangement obtained by precipitation upon a germanium-silicon layer, of a further germanium layer which may be doped if desired;

FIG. 3 represents a germanium transistor the emitter and base zones of which are made in accordance with the invention; and FIG. 4 illustrates another semiconductor arrangement.

Referring now to FIG. 1, numeral 2 indicates a quartz vessel in which is disposed a support 5 upon which is positioned a carrier, for example, a single-crystalline silicon wafer 6. The support 5 consists of a material from which no impurities can during the respective operations, diffuse into the carrier body, which might detrimentally affect the semiconductor properties thereof, for example, of silicized carbon or consisting of highly pure semiconductor material, for example, likewise of silicon.

In the example shown, the heating to the required working temperature is effected inductively by means of a high frequency coil 3. However, the support 5 may be utilized as a heat conductor, for example, by heating it by direct passage of current therethrough, whereby the heat produced is transmitted to the carrier 6. The carrier 5 may for this purpose be provided with suitable current leads for conducting current thereto. The coil 3 may in such case be constructed as a heating coil such as used for resistance heating, and may serve for preheating.

The surface of the single-crystalline carrier 6 must be highly pure. The carrier 6 is for this purpose, prior to being placed upon the support 5, dipped into an etching solution, for example, concentrated nitric acid and concentrated hydrofluoric acid in a ratio of 1 to 1, etched therein, and is thereupon positioned upon the support and annealed in a hydrogen stream at about 1230° C.

The reaction mixture consisting, for example, of hydrogen and a germanium halide, for example, germanium tetrachloride or germanium chloroform, is thereupon introduced through the gas inlet 1 and is thermally decomposed upon the heated carrier 6. The surface temperature of the carrier 6 can thereby lie either above the melting point of the germanium, at the melting or solidification temperature required for the desired alloy composition, so that the alloy formation starts incident to the precipitation of the germanium on the silicon carrier, or it may lie below the melting point of the germanium, for example, upon using germanium tetrachloride, at 600° C. to 900° C., so that no alloy formation is effected during the precipitation.

If the surface temperature of the carrier is held below the melting point of the germanium, the silicon carrier 6 is, after separation or precipitation of a uniformly thick germanium layer, slowly highly heated respectively to the melting and solidification temperature required for the desired alloy composition, which temperature can be obtained from the two-substance diagram germanium-silicon, and is held at such temperature until appearance of the equilibrium of the binary system which corresponds to this temperature. For example, at a temperature of about 1150° C. there is obtained a germanium-silicon alloy which is composed of about 60 atom percent silicon and about 40 atom percent germanium. Upon appearance of the equilibrium of the binary system, the temperature of the carrier 6 is slowly and steadily reduced until the precipitated semiconductor material with small band spacing is completely consumed for the alloy formation. The thickness of the remaining unalloyed carrier layer and the thickness of the alloyed layer are determined by the amount of the separated or precipitated germanium The surface temperature of the carrier 6 is after the alloy formation reduced to a temperature lying about 20° C. to 200° C. below the melting temperature of the alloy, and the arrangement is tempered in a stream of pure hydrogen. This tempering serves for setting a desired concentration drop within the alloy layer and also for monocrystal formation, at which the single-crystalline silicon carrier is operable as a seed.

The temperature of the carrier is after this tempering further reduced, and the reaction mixture is again introduced into the reaction vessel, for example, at a temperature lying at 600° C. to 900° C., so as to effect renewed thermal decomposition of the gaseous germanium compound upon the carrier, thereby precipitating upon the monocrystalline alloy layer, a single-crystalline germanium layer.

The doping of the individual layers may be effected, for example, from the gas phase, by adding doping substances to the reaction mixture. However, the doping of the alloy layer can also be achieved by building-in impurity centers from the corresponding doped carrier 6. For example, when using an n-doped carrier and alloying thereinto, in accordance with the invention, highly pure germanium, there will be obtained an n-doped alloy layer. This n-doping of the alloy layer can however also be effected by the use of an n-doped layer and precipitation thereon of an n-doped germanium layer. It is moreover possible to precipitate upon a highly pure silicon carrier n-doped germanium from the gas phase and to build into the alloy layer impurity centers from the germanium layer during the alloying.

Upon precipitating a further, if desired doped germanium layer, there will be obtained a semiconductor arrangement such as is shown in FIG. 2. The remaining silicon of the carrier 7 and if desired parts of the germanium silicon layer 8 can now be removed in known manner by sawing, lapping or etching. Depending upon the size of the semiconductors layers, they can be subdivided, for example, by means of ultra sound saws or by splitting, to form smaller arrangements.

FIG. 3 shows a germanium transistor comprising an emitter zone and a base zone made in accordance with the invention. The base zone 12 consists of p-doped germanium and the emitter layer 13 consists of an n-doped germanium-silicon alloy. Into the base zone 12 is alloyed, for example, a pill 11 consisting of a gold-antimony alloy which forms with the base layer the collector pn-junction 20. The collector layer may however also be formed, for example, by precipitation of a further n-doped germanium layer upon a p-doped germanium layer. The emitter layer is contacted barrier-free, for example, by means of an electrode 15 made of gold with an addition of antimony. The base contacts 14 and 16 are formed by alloying-in trivalent metal, for example, aluminum pins, or by alloying-in a ring of gold containing an addition of boron.

It is however also possible to introduce into the reaction vessel, after the tempering for the single-crystal formation of the alloy layer, a reaction mixture consisting of a silicon halide, for example, silicontetrachloride or siliconchloroform, and hydrogen, which is thermally decomposed upon the single-crystalline silicon layer. The separation or precipitation temperature is in such a case about as high as the temperature applied for the the tempering.

There is thus obtained a semiconductor arrangement such as illustrated in FIG. 4. The carrier 17 which is, for example, p-doped need not be removed but forms a zone, for example, as in a junction transistor. The silicon layer 19 is doped upon precipitation from the gas phase, for example, p-doped, while the alloy layer 18 is n-doped by precipitation of an n-doped germanium layer and alloying-in of such layer. Upon precipitation of the germanium, the amount of n-doped impurity centers must be so great that the n-doping predominates in the alloying-in of germanium in the p-doped silicon carrier 17.

The three layers can be contacted barrier-free in known manner and can serve as emitter-, base- and collector layers of a transistor. The base layer can be made very thin in accordance with the invention and plane large area pn-junctions will be obtained. In germanium-silicon alloys with moderate silicon content, the life of the charge carriers will exceed the values heretofore obtainable with silicon. Accordingly, a silicon transistor, with a silicon-germanium alloy as a base zone, will exhibit better electrical properties than a transistor in which all three zones are made of silicon.

It is possible to make in this manner also other semiconductor arrangements, for example, diodes, especially four-layer diodes with great emitter yield.

Changes may be made within the scope and spirit of the appended claims which define what is believed to be new and desired to have protected by Letters Patent.

We claim:

1. A method of producing a semiconductor device having at least one single crystal semiconductor layer consisting of an alloy of germanium and silicon, comprising the following steps, namely, thermally decomposing, upon a uniformly heated single crystal carrier consisting of silicon, a gaseous compound of germanium, to precipitate a germanium layer thereon, heating the carrier and such precipitate to a temperature required for the desired composition of the alloy and thereafter slowly and steadily cooling said carrier, whereby the precipitated germanium is wholly consumed for the formation of the alloy, and thereupon tempering the formed alloy at a temperature lying below the temperature of the melting point of the alloy.

2. A method according to claim 1, comprising adding a doping substance to the carrier to effect a doping of the alloy layer during the precipitation thereof.

3. A method according to claim 1, comprising adding a doping substance to the atmosphere containing the reaction gas to effect a doping of the alloy layer during the precipitation thereof.

4. A method according to claim 1, comprising adding doping substances to the carrier and to the atmosphere containing the reaction gas to effect a doping of the alloy layer during the precipitation thereof.

5. A method according to claim 1, comprising precipitating upon the single crystal semiconductor layer formed by the alloy, at a temperature lying below the melting temperature of the alloy of the two semiconductor materials, a further semiconductor layer.

6. A method according to claim 1, comprising precipitating upon the single crystal semiconductor layer formed by the alloy, at a temperature lying below the melting temperature of the alloy of the two semiconductor materials, a further doped semiconductor layer.

7. A method according to claim 5, comprising adding doping substances to the reaction mixture for the purpose of doping the precipitated layers during the separation thereof from the gaseous phase.

8. A method according to claim 1, comprising removing, upon conclusion of the precipitation operation, that portion of the silicon not alloyed with germanium.

9. A method according to claim 1, comprising removing the carrier upon conclusion of the precipitation operation.

10. A method according to claim 1, comprising removing the carrier and parts of the alloy layer upon conclusion of the precipitation thereof.

11. A method according to claim 1, comprising positioning the carrier upon a support, and heating said support to heat said carrier.

12. A silicon transistor comprising a zone operable as an emitter zone and a zone operable as a collector zone made of silicon, and a zone operable as a base zone made of a germanium-silicon alloy.

13. A germanium transistor comprising a zone operable as an emitter zone made of a germanium-silicon alloy and a zone operable as a base zone and a zone operable as a collector zone made respectively of germanium.

References Cited by the Examiner

UNITED STATES PATENTS

| | | | |
|---|---|---|---|
| 2,701,216 | 2/1955 | Seiler | 148—1.5 |
| 2,780,569 | 2/1957 | Hewlett | 148—1.5 |
| 2,855,334 | 10/1958 | Lehovec | 148—1.5 |
| 2,910,394 | 10/1959 | Scott et al. | 148—1.5 |
| 3,088,852 | 5/1963 | Cornelison et al. | 148—180 |
| 3,099,588 | 7/1963 | New et al. | 148—180 |

FOREIGN PATENTS

| | | |
|---|---|---|
| 1,029,941 | 5/1958 | Germany. |
| 737,527 | 9/1955 | Great Britain. |
| 742,237 | 12/1955 | Great Britain. |
| 805,493 | 12/1958 | Great Britain. |
| 815,564 | 8/1959 | Great Britain. |
| 818,564 | 8/1959 | Great Britain. |

DAVID L. RECK, *Primary Examiner.*

RAY K. WINDHAM, HYLAND BIZOT, *Examiners.*